United States Patent [19]

Fisher et al.

[11] 4,268,802
[45] May 19, 1981

[54] MODULATION DISTORTION REDUCER

[76] Inventors: Charles B. Fisher, 2850 Hill Park Rd., Montreal, Quebec H3H 1T1, Canada; Sidney T. Fisher, 53 Morrison Ave., Town of Mt. Royal, Montreal, Quebec H3R 1K3, Canada

[21] Appl. No.: 41,608

[22] Filed: May 23, 1979

[51] Int. Cl.³ .............................................. H03C 1/06
[52] U.S. Cl. ............................... 332/37 D; 455/126; 455/295; 455/63
[58] Field of Search ..................... 332/37 R, 37 D; 329/168, 169; 325/472, 473, 475, 476, 480, 482, 483, 182; 455/295, 296, 305, 308–311, 126, 63

[56] References Cited

U.S. PATENT DOCUMENTS 3,614,669 10/1971 Gargini ............................. 332/37 R
3,831,094 8/1974 Stover ........................... 332/37 D X Primary Examiner—Siegfried H. Grimm
Assistant Examiner—Edward P. Westin

[57] ABSTRACT

A double-sideband amplitude modulated (DSBAM) carrier passed through band-pass circuits wich are too narrow for the modulated carrier or are misaligned, may have one or both side-bands altered in relative amplitude, or in phase relative to the carrier. These effects result in amplitude modulation distortion and produce angle modulation of the carrier, with the same waveform as the amplitude distortion. In this invention the angle modulation is detected and applied to an amplitude modulator in the required phase and amplitude to substantially eliminate the distortion of the modulated carrier.

3 Claims, 2 Drawing Figures

MODULATION DISTORTION REDUCER

BACKGROUND OF THE INVENTION

This disclosure provides means for reducing amplitude distortion of a DSBAM carrier caused by bandpass circuits, comprising an angle modulation detector which produces a wave of the distortion waveform, which modulates the carrier in opposition to the distortion of the DSBAM carrier. We have no knowledge of prior patent art, publications or apparatus which anticipate or are relevant to our invention.

BRIEF DESCRIPTION OF THE INVENTION

A carrier double-sideband amplitude modulated by a single modulating frequency has two sidebands of equal amplitude, equal frequency spacing on each side of the carrier, and phased so that the sidebands are in phase with each other at the instants they are in phase with, or in phase opposition to, the carrier. The carrier has no angle modulation.

If the DSBAM carrier is passed through band-pass circuits which are too narrow or are misaligned so that one or both sidebands are affected, the affected sideband or sidebands are shifted in phase and reduced in amplitude. Unless the two sidebands are equally affected in phase and amplitude the resultant modulated carrier produces distortion when demodulated in an amplitude modulation detector. As a result of distortion the distorted double-sideband amplitude modulated carrier also has angle modulation, with the same waveform as the amplitude distortion. In this invention the angle modulation is detected and used as a modulating wave in an amplitude modulator, with the phase and level necessary to substantially eliminate the amplitude modulation distortion of the carrier. In a preferred embodiment of the invention negative-feedback regulates the levels around a loop which includes the angle modulation detector and the amplitude modulator.

LIST OF DRAWINGS

The invention is more readily understood by reference to the following drawings.

DETAILED DESCRIPTION OF THE INVENTION

A carrier with undistorted double-sideband amplitude modulation at a single frequency, which causes no loss of generality in this analysis, as the principle of superposition applies, has two sidebands of equal amplitude, spaced equally in frequency on each side of the carrier, and phased so that the two sidebands are in phase with each other at instants at which they are in phase with, or in phase opposition to, the carrier. When the modulated carrier is altered so that the above relations are not true, the amplitude modulated carrier will also have angle modulation and amplitude modulation distortion. When the alteration of the carrier is caused by a narrow symmetrical band-pass circuit the sidebands may be equally reduced in amplitude and one sideband may be advanced in phase by the same angle by which the other sideband is retarded in phase. In this case no angle modulation or modulation distortion results, except that the depth of amplitude modulation is reduced.

When the modulated carrier is affected by a bandpass circuit one or both sidebands may be reduced in amplitude so that they are no longer equal in amplitude, and one or both sidebands may be shifted in phase so that the sidebands are not in phase with each other at the instants that they are in phase with, or opposed in phase to, the carrier. As is well known this causes angle modulation of the carrier, and amplitude modulation distortion. The waveform of the angle modulation is identical with that of the amplitude modulation distortion, when complex amplitude modulation is used, but the angle modulation is displaced ±90° from the distortion, the sign of the angle depending on the type of band-pass circuit which alters the modulated carrier, that is whether the band-pass circuit is equivalent to a series resonant or shunt resonant circuit.

In order better to stabilize the out-of-phase modulation of the distorted modulated carrier, an amplitude modulator and an angle detector may be used in a negative-feedback loop. Whether this loop is used or not, the invention basically uses negative-feedback theory, and suitable phase and frequency equalizers, according to that theory, may be utilized.

Usual types of amplitude modulation detectors are not responsive to angle modulation.

Figure 1:
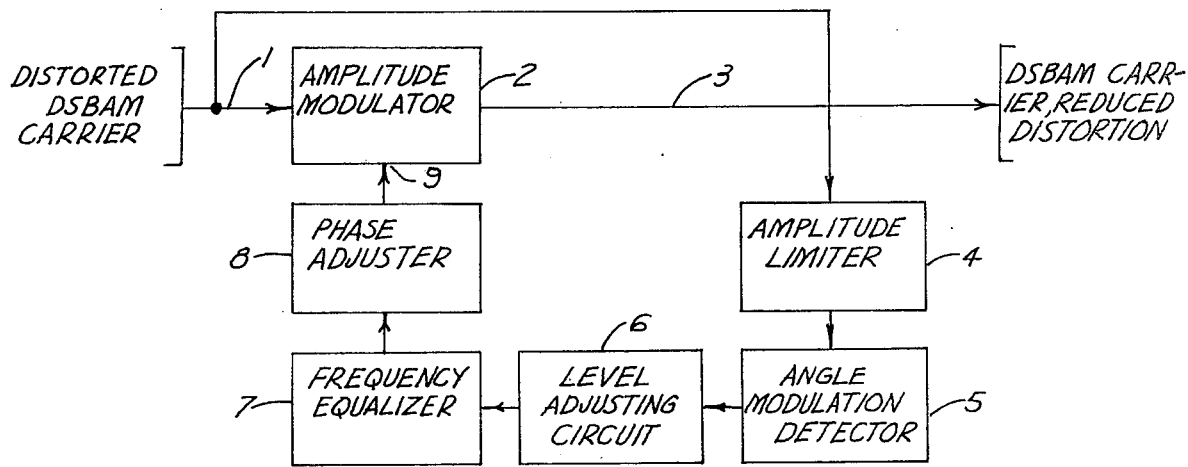
FIG. 1 shows an angle modulation detector which delivers a modulating wave to an amplitude modulator to correct amplitude modulation distortion.

FIG. 1 shows an embodiment of the invention in which a negative-feedback loop is not used. A distorted DSBAM carrier appears on lead 1 and is delivered to amplitude modulator 2 and amplitude limiter 4. Limiter 4 removes amplitude modulation and delivers an angle modulated wave to angle modulation detector 5, a well known device. The output of detector 5 is delivered to level adjusting circuit 6, which is an amplifier with gain adjusted to a design value. The output of circuit 6 passes successively through frequency equalizer 7 and phase adjuster 8 to the modulating wave input terminal 9 of modulator 2. Circuit 6 and equalizers 7 and 8 adjust the output of detector 6 in level, frequency response and phase so that the wave delivered to terminal 9 amplitude modulates the distorted modulated carrier on lead 1 in opposition to the distortion present on the carrier, that is the angle modulation is substantially cancelled. Thus modulator 2 delivers a substantially undistorted DSBAM carrier to output lead 3.

Figure 2:
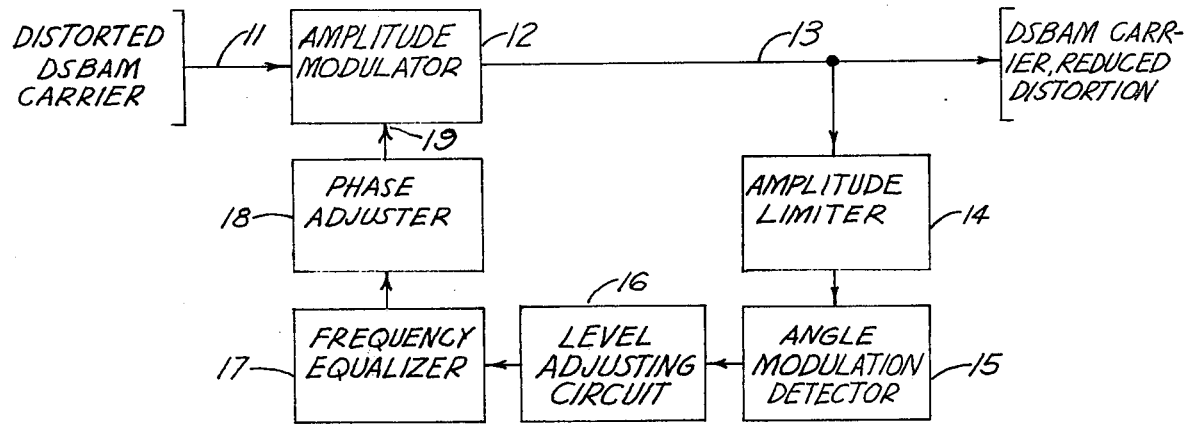
FIG. 2 shows an angle modulation detector which forms part of a negative-feedback loop including an amplitude modulator, which corrects amplitude modulation distortion.

FIG. 2 shows an embodiment of the invention which comprises the same elements as FIG. 1 with different parameters and has them connected in a negative-feedback loop, so that changes in characteristics of the elements from their design values are substantially compensated for, as is well known in feedback theory. In order to achieve such feedback compensation, the theory that the frequency response and phase characteristics of the elements must be controlled over a frequency range much greater than the range of the modulated carrier. This is necessary in order that positive feedback does not occur around the loop at any frequency. In FIG. 2 a distorted DSBAM carrier is delivered via lead 11 to amplitude modulator 12, which delivers the DSBAM carrier with substantially reduced distortion to output lead 13. This output is also delivered to amplitude limiter 14 which removes substantially all amplitude modulation and delivers the carrier, with angle modulation due to the distorted DSBAM carrier on lead 11, to angle modulation detector 15. The output of detector 15 passes successively through level adjusting circuit 16, frequency equalizer 17 and phase adjuster 18 to modulating wave terminal 19 of modulator 12. At terminal 19 the wave has the correct waveform, amplitude and phase to modulate the distorted DSBAM carrier on lead 11 substantially equally but opposed in phase to the distortion. Thus in accordance with well known negative-feedback theory the loop formed by modulator 12, limiter 14, detector 15, circuit 16, equalizer 17 and adjuster 18 produces a DSBAM carrier with substantially reduced modulation distortion on lead 13.

We claim:

1. Distortion reducing apparatus for a distorted double-sideband amplitude modulated carrier with sidebands of unequal amplitude or unequal phase relationship to the carrier, or both, which comprises an amplitude modulator which receives said distorted modulated carrier and delivers the modulated carrier with reduced distortion to an output circuit, and an angle modulation detection and compensation circuit, which receives said modulated carrier with at least some angle modulation and delivers its output as a modulating wave to said amplitude modulator with a phase and level which cause said modulator to substantially reduce the distortion of said distorted modulated wave.

2. Distortion reducing apparatus according to claim 1, in which said angle modulation detection and compensation circuit comprises:
   an amplitude limiter, and
   an angle modulation detector which receives the output of said amplitude limiter, and
   a level adjusting device and a frequency equalizer which receive the output of said angle modulation detector, and
   a phase adjusting device which receives the output of said level adjusting device, shifts it in phase and delivers it to the modulating input of said amplitude modulator.

3. Distortion reducing apparatus according to claim 2 in which said amplitude limiter receives the output of said amplitude modulator.

* * * * *

UNITED STATES PATENT AND TRADEMARK OFFICE
CERTIFICATE OF CORRECTION

PATENT NO. : 4,268,802
DATED : May 19, 1981
INVENTOR(S) : Charles B. Fisher and Sidney T. Fisher It is certified that error appears in the above—identified patent and that said Letters Patent is hereby corrected as shown below:

Column 2, line 43, change "...output of detector 6 in level, frequency response and..." to "...output of detector 5 in level, frequency response and...".

Column 2, line 57, change "...ory that the frequency response and phase characteris..." to "...ory teaches that the frequency response and phase characteris...".

Signed and Sealed this

Twenty-eighth Day of July 1981

[SEAL]

Attest:

GERALD J. MOSSINGHOFF

*Attesting Officer*  *Commissioner of Patents and Trademarks*